United States Patent
Takahashi et al.

(10) Patent No.: US 9,960,006 B2
(45) Date of Patent: May 1, 2018

(54) CHARGED-PARTICLE-BEAM DEVICE

(71) Applicant: HITACHI HIGH-TECHNOLOGIES CORPORATION, Minato-ku, Tokyo (JP)

(72) Inventors: Noritsugu Takahashi, Tokyo (JP); Yasunari Sohda, Tokyo (JP); Wataru Mori, Tokyo (JP); Yuko Sasaki, Tokyo (JP); Hajime Kawano, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days. days.

(21) Appl. No.: 15/310,438

(22) PCT Filed: Apr. 28, 2015

(86) PCT No.: PCT/JP2015/062759
§ 371 (c)(1),
(2) Date: Nov. 10, 2016

(87) PCT Pub. No.: WO2015/174268
PCT Pub. Date: Nov. 19, 2015

(65) Prior Publication Data
US 2017/0092459 A1    Mar. 30, 2017

(30) Foreign Application Priority Data
May 13, 2014    (JP) ................................. 2014-099672

(51) Int. Cl.
*G01N 23/22*    (2006.01)
*G01N 23/225*    (2006.01)
(Continued)

(52) U.S. Cl.
CPC .............. *H01J 37/05* (2013.01); *H01J 37/12* (2013.01); *H01J 37/147* (2013.01);
(Continued)

(58) Field of Classification Search
USPC ... 250/306, 307, 309–311, 397–399, 441.11, 250/492.1, 492.2, 492.21, 492.3, 396 R,
(Continued)

(56) References Cited

U.S. PATENT DOCUMENTS 7,138,629 B2 * 11/2006 Noji ..................... G01N 23/225
250/310
8,217,363 B2 * 7/2012 Hatano ................ G01N 23/225
250/310
(Continued)

FOREIGN PATENT DOCUMENTS

JP    2003-187733 A    7/2003
JP    2004-342341 A    12/2004
(Continued)

*Primary Examiner* — Bernard Souw
(74) *Attorney, Agent, or Firm* — Miles & Stockbridge P.C.

(57) ABSTRACT

A charged-particle-beam device used for measuring the dimensions, etc., of fine circuit patterns in a semiconductor manufacturing process, wherein corrections are made in the defocusing and astigmatism generated during changes in the operating conditions of a Wien filter acting as a deflector of secondary signals such as secondary electrons, and the display dimensions of obtained images are kept constant. In the charged-particle-beam device, the Wien filter (23) is arranged between a detector and a lens (11) arranged on the test-sample side among two stages of lenses for converging a charged-particle beam, and a computing device (93) is provided for the interlocked control of the Wien filter (23) and a lens (12) arranged on the charged-particle-source side among the two stages of lenses.

14 Claims, 9 Drawing Sheets

(51) Int. Cl.
*G21K 7/00* (2006.01)
*H01J 37/28* (2006.01)
*H01J 37/05* (2006.01)
*H01J 37/147* (2006.01)
*H01J 37/153* (2006.01)
*H01J 37/21* (2006.01)
*H01J 37/244* (2006.01)
*H01J 37/26* (2006.01)
*H01J 37/12* (2006.01)

(52) U.S. Cl.
CPC ............ *H01J 37/153* (2013.01); *H01J 37/21* (2013.01); *H01J 37/244* (2013.01); *H01J 37/265* (2013.01); *H01J 37/28* (2013.01); *H01J 2237/1532* (2013.01); *H01J 2237/2448* (2013.01)

(58) Field of Classification Search
USPC .......................................... 250/396 ML, 526
See application file for complete search history.

(56) References Cited

U.S. PATENT DOCUMENTS

| | | | | |
|---|---|---|---|---|
| 8,692,195 B2* | 4/2014 | Ito | ............... | H01J 37/244 250/306 |
| 8,735,814 B2* | 5/2014 | Sohda | ............... | H01J 37/153 250/306 |
| 2008/0237465 A1* | 10/2008 | Hatano | ............... | G01N 23/225 250/311 |
| 2011/0291010 A1* | 12/2011 | Katane | ............... | H01J 37/244 250/310 |
| 2013/0026363 A1* | 1/2013 | Katane | ............... | H01J 37/244 250/311 |
| 2013/0270435 A1* | 10/2013 | Sohda | ............... | H01J 37/153 250/306 |

FOREIGN PATENT DOCUMENTS

JP 2008-243485 A 10/2008
WO WO 2012/050018 A 4/2012

* cited by examiner

CHARGED-PARTICLE-BEAM DEVICE

TECHNICAL FIELD

The present invention relates to a charged particle beam apparatus ta can be used for measurement.

BACKGROUND ART

A scanning electron microscope as a mode of a charged particle beam apparatus is an apparatus that converges a primary charged particle beam accelerated and emitted from a charged particle source using an electromagnetic lens and detects a secondary signal obtained from a sample when the surface of the sample is irradiated with the primary charged particle beam by electromagnetic deflection while scanning to convert the secondary signal into an image. The scanning electron microscope using an electron source as a charged particle source is widely known as a representative apparatus in this mode and fine shapes can be observed by converging a primary electron beam diminutively and so is used for dimensional measurement and the like of fine circuit patterns in a semiconductor manufacturing process.

The secondary signal obtained when the sample is irradiated with a primary electron beam is a signal having various levels of energy such as secondary electrons and reflected electrons. By selecting and detecting energy of the secondary signal, an image having desired information can be acquired. In an optical system in which a secondary signal travels onto an optical path of primary electrons and a detector to detect the secondary signal is arranged outside an axis of the optical path of primary electrons, it is necessary to deflect the secondary signal without deflecting the primary electron beam.

As a means for implementing this, an apparatus using a Wien filter as a deflecting means of the secondary signal is described in PTL 1. In PTL 1, correcting changes of a curvature of field due to changes of a deflection angle of a primary electron beam by a magnetic pole of an objective lens and causing deflection color aberration using an E×B separator is described.

Also, an apparatus that suppresses a curvature of field as geometric aberration and astigmatism is described in PTL 2. In PTL 2, correcting a curvature of field and astigmatism caused by a Wien filter operating as a deflection color aberration correcting element inside the deflection color aberration correcting element is described.

CITATION LIST

Patent Literature

PTL 1: JP 2003-187733 A
PTL 2: WO 2012/050018 A

SUMMARY OF INVENTION

Technical Problem

Incidentally, when a Wien filter is used as a deflector of a secondary signal in a detector and energy of a secondary signal is switched for detection, it is necessary to switch the action of the Wien filter. At this point, the amount of aberration of a primary electron beam such as a curvature of field and astigmatism caused by the Wien filter changes and thus, a focal position on a sample also changes. Particularly when energy of the secondary signal to be detected is switched significantly, a change of the focal position manifests itself. Further, when energy of the secondary signal to be detected is switched, if defocusing is corrected by a means of correcting the focal position on the sample, deflection sensitivity of the primary electron beam is affected, posing a problem that an error of display dimensions of an acquired image occurs.

In the above Citation List, defocusing and deflection sensitivity deviations caused by switching energy of the secondary signal deflected by the Wien filter are not assumed. Thus, in PTL 1, the Wien filter acts as a portion of the deflector that deflects primary electrons and the effect is limited to correcting defocusing by linking an electrostatic lens arranged on the sample side from the primary electron deflector. In PTL 2, the Wien filter is not used as a deflector of the secondary signal.

An object of the present invention is to provide a charged particle beam apparatus capable of correcting defocusing and astigmatism caused when operating conditions of a Wien filter acting as a deflector of a secondary signal are changed and holding display dimensions of an acquired image in a constant state.

Solution to Problem

To achieve the above object, one representative charged particle beam apparatus of the present invention is provided with a Wien filter arranged between a lens arranged on a side of a sample of 2-stage lenses to converge a charged particle beam and a detector and further, a processor that controls the Wien filter and a lens arranged on the side of the charged particle source of the 2-stage lenses in linkage.

For example, a configuration described in CLAIMS is adopted. The present application includes a plurality of means for solving the above problem and an example thereof is provided as: a charged particle beam apparatus including a charged particle source; 2-stage lenses for converging a primary charged particle beam emitted from the charged particle source on a sample, wherein a first lens arranged on a side of the charged particle source and a second lens arranged on a side of the sample are included; a deflector that specifies an irradiation position of the primary charged particle beam on the sample; a detector arranged between the 2-stage lenses to detect a secondary charged particle signal generated by the sample being irradiated with the primary charged particle beam from the sample; a first Wien filter arranged between the detector and the second lens to deflect the secondary charged particle signal; and a processor that controls the first Wien filter and the first lens in linkage.

Advantageous Effects of Invention

According to the present invention, defocusing and astigmatism caused when operating conditions of a Wien filter acting as a deflector of a secondary signal are changed can be corrected and display dimensions of an acquired image can be held in a constant state.

Further features related to the present invention will be apparent from the description of this specification and appended diagrams. Other problems, configurations, and effects than those described above will be apparent from the description of examples described below.

DESCRIPTION OF EMBODIMENTS

Hereinafter, the examples of the present invention will be described with reference to the appended drawings. The appended drawings shows concrete examples conforming to the principle of the present invention, but these examples are intended for a better understanding of the present invention and are never used for a restrictive interpretation of the present invention.

As a sample observation apparatus, a charged particle beam apparatus that scans a primary charged particle beam (typically, electrons) emitted from a charged particle source on the surface of a sample to detect a signal of secondary charged particles generated secondarily is known. The present invention can be applied to charged particle beam apparatuses in general. Representative examples of the charged particle beam apparatus include a scanning electron microscope (SEM).

Example 1

Figure 1:
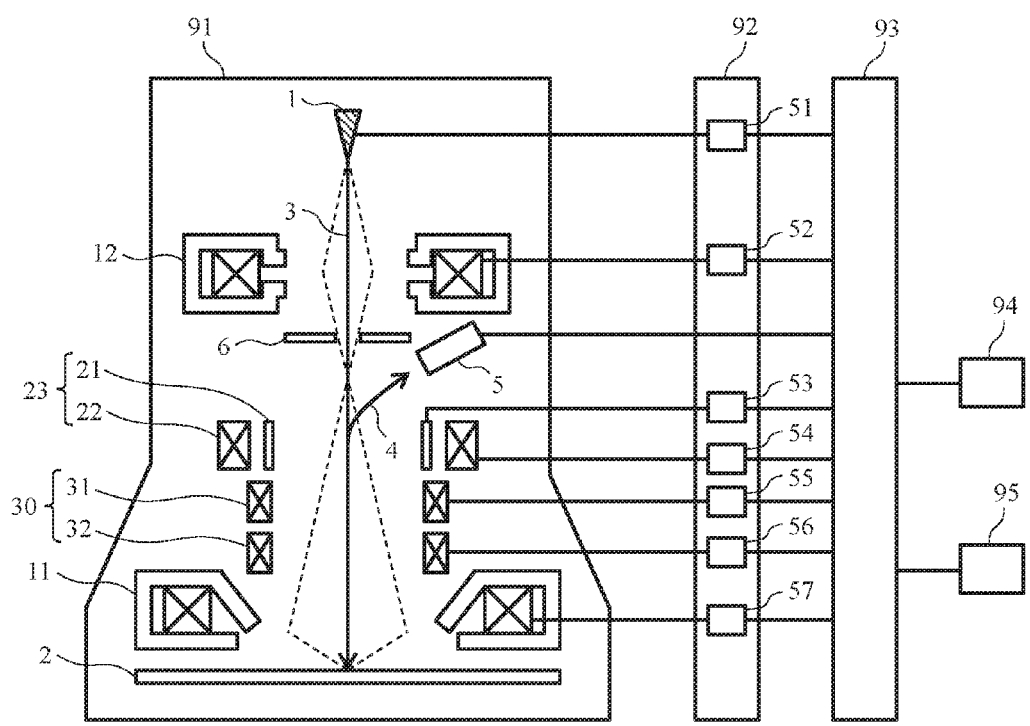
FIG. 1 is an overall configuration diagram of a charged particle beam apparatus (scanning electron microscope) according to Example 1.

Example 1 will be described using FIGS. 1 to 4. FIG. 1 is an overall configuration diagram of a scanning electron microscope as a form of a charged particle beam apparatus according to the present example.

The scanning electron microscope includes an electron-optical lens barrel 91, a power unit 92 to supply an operating voltage/driving current to various components of the electron-optical lens barrel 91, a processor 93 that centrally controls a whole system, a storage device 94 attached to the processor 93, and an input/output apparatus 95. The input/output apparatus 95 includes an input apparatus such as a mouse or a keyboard and an output apparatus such as a display (display unit).

The electron-optical lens barrel 91 includes an electron source 1, an observation sample 2, a detector 5, a current limiting diaphragm 6, an objective lens 11, a condensing lens 12, a Wien filter for secondary signal deflection 23, and a 2-stage scanning deflector 30. The detector 5 is arranged between 2-stage lenses (the objective lens 11, the condensing lens 12). The Wien filter for secondary signal deflection 23 is constructed of an electrostatic deflector 21 and an electromagnetic deflector 22. The 2-stage scanning deflector 30 is constructed of an upper scanning deflector 31 and a lower scanning deflector 32.

A primary electron beam 3 emitted from the electron source 1 successively passes through the condensing lens 12 and the objective lens 11 before being converged on the observation sample 2 as a microscopic spot for irradiation. In the meantime, the primary electron beam 3 on the observation sample 2 is two-dimensionally scanned by the 2-stage scanning deflector 30 constructed of the upper scanning deflector 31 and the lower scanning deflector 32.

A secondary signal 4 such as secondary electrons and reflected electrons emitted from the observation sample 2 due to irradiation with the primary electron beam 3 is detected by the detector 5 positioned between the 2-stage lenses (the objective lens 11, the condensing lens 12). The signal detected by the detector 5 is sent to the processor 93. Image processing is performed by the processor 93 based on input information and a two-dimensional image corresponding to the irradiation position of the primary electron beam 3 scanned two-dimensionally is displayed in a display or the like of the input/output apparatus 95.

The Wien filter for secondary signal deflection 23 is arranged on the side of the observation sample 2 from the detector 5. The Wien filter for secondary signal deflection 23 is arranged between the detector 5 and the objective lens 11 to deflect secondary electrons and reflected electrons in the direction of the detector 5. The Wien filter for secondary signal deflection 23 can deflect secondary electrons and reflected electrons in the direction of the detector 5 without deflecting the primary electron beam 3 by orthogonalizing an electric field of the electrostatic deflector 21 and a magnetic field of the electromagnetic deflector 22. Here, the operating condition of the Wien filter that does not deflect the primary electron beam 3 is called the Wien condition. Unless there are exceptional circumstances, the Wien filter described in the present example is used under the condition of not deflecting the primary electron beam 3.

The power unit 92 is a collection of control power supply of each component of the electron-optical lens barrel 91. The power unit 92 is controlled by the processor 93. The power unit 92 includes a voltage source 51 that controls an applied voltage to the electron source 1, a voltage source 53 that controls an applied voltage to the electrostatic deflector 21, a current source 52 that controls a current applied to the condensing lens 12, a current source 57 that controls a current applied to the objective lens 11, a current source 54 that controls a current applied to a coil of the electromagnetic deflector 22, and current sources 55, 56 that control a current applied to the upper scanning deflector 31 and the lower scanning deflector 32 respectively. If the upper scanning deflector 31 and the lower scanning deflector 32 are electrostatic deflectors, a voltage source may be included instead of the current sources 55, 56.

Figure 2:
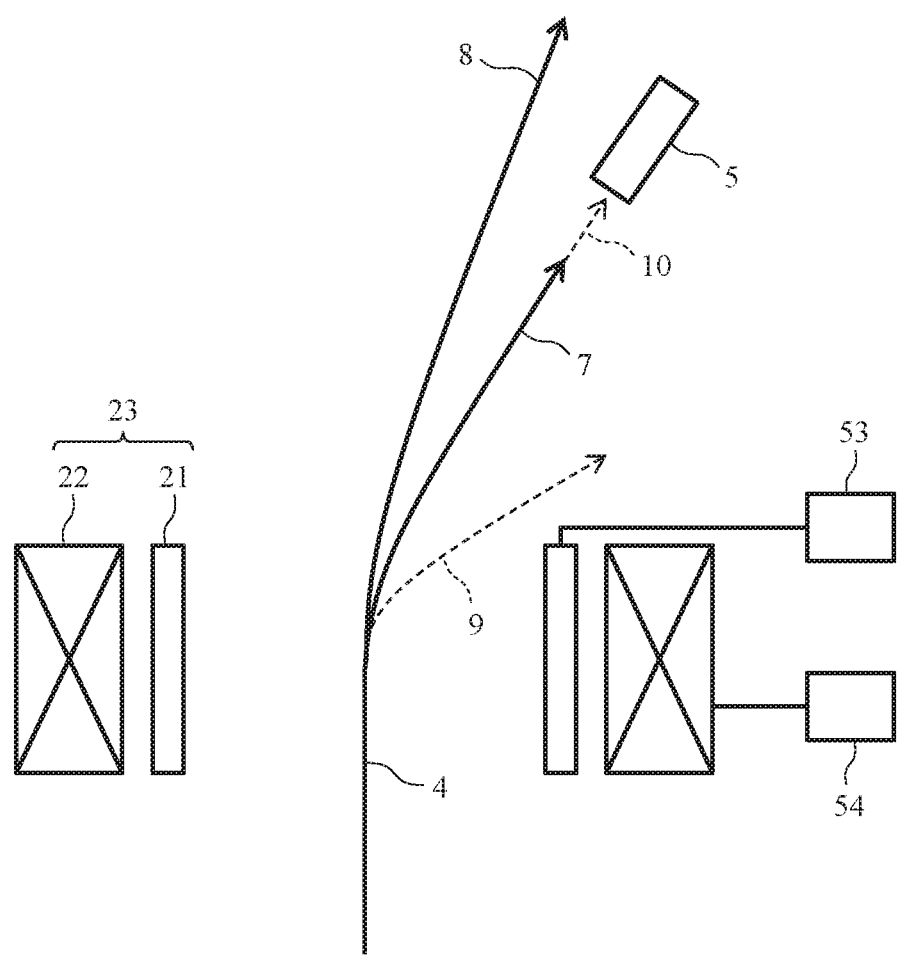
FIG. 2 is a schematic diagram illustrating a trajectory of secondary electrons passing through a Wien filter according to Example 1.

FIG. 2 shows details of trajectories of secondary electrons or reflected electrons passing through a Wien filter for secondary signal deflection. In the Wien filter for secondary signal deflection 23, the voltage source 53 of the electrostatic deflector 21 and the current source 54 of the electromagnetic deflector 22 are driven such that the Wien condition is fulfilled. Secondary electrons and reflected electrons 4 advancing into the Wien filter for secondary signal deflection 23 are separated into secondary electrons 7 of low energy and reflected electrons 8 of high energy and the secondary electrons 7 enter the detector 5. If the reflected electrons 8 should enter the detector 5, outputs of the voltage source 53 and the current source 54 are changed such that the reflected electrons 8 change to a trajectory of reflected electrons 10 indicated by a broken line while the Wien condition is fulfilled. At this point, the secondary electrons 7 change to a trajectory of secondary electrons 9 indicated by a broken line. By switching outputs of the voltage source 53 and the current source 54 as described above, energy of a secondary signal to be detected can be selected.

Figure 3:
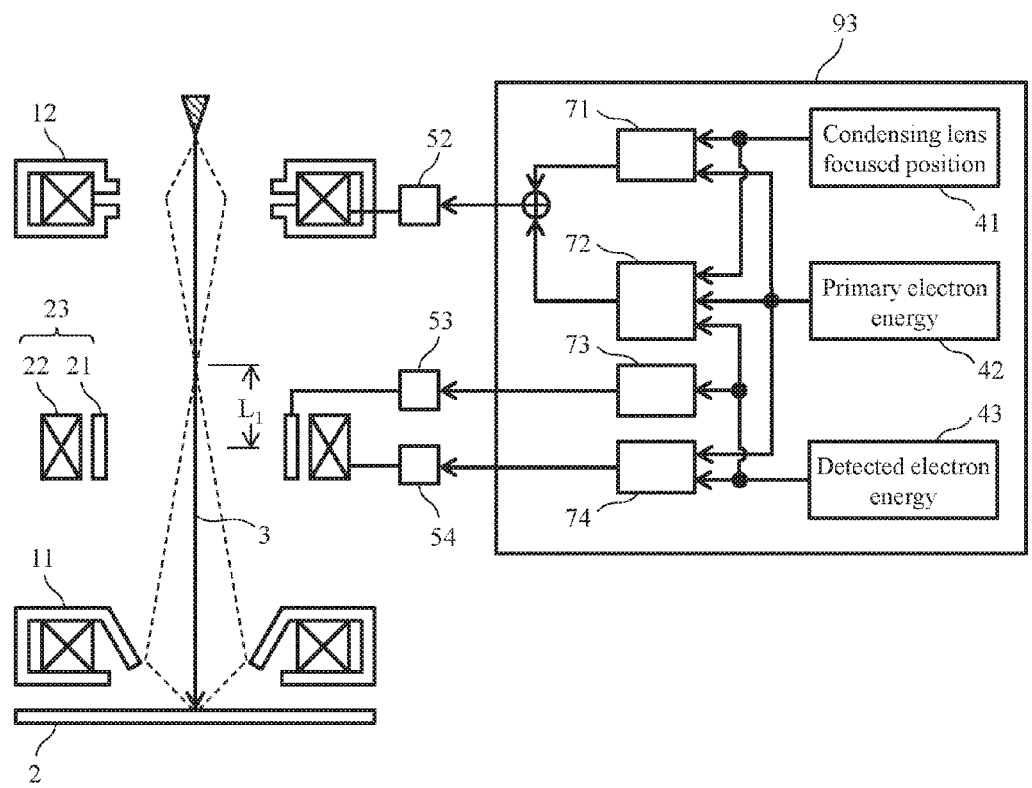
FIG. 3 is a schematic diagram illustrating gang control of the Wien filter according to Example 1 and a condensing lens.

FIG. 3 schematically shows details of a configuration in which the Wien filter for secondary signal deflection 23 and the condensing lens 12 are controlled in linkage. The processor 93 calculates the action (indicated value to the current source 52) of the condensing lens 12 from a deflection amount of a secondary electron signal of the Wien filter for secondary signal deflection 23 so that the Wien filter for secondary signal deflection 23 and the condensing lens 12 are controlled in linkage.

The processor 93 includes a drive current calculator 71 of the condensing lens 12, a drive current calculator 72 of the condensing lens 12 linked with the Wien filter for secondary signal deflection 23, an applied voltage calculator 73 of the electrostatic deflector 21 constituting the Wien filter for secondary signal deflection 23, and a drive current calculator 74 of the electromagnetic deflector 22 constituting the Wien filter for secondary signal deflection 23.

When an indicated value 41 of the condensing lens focused position and an indicated value 42 of primary electron energy are input into the drive current calculator 71 of the condensing lens 12, the drive current calculator 71 outputs an indicated value of the current source 52 of the condensing lens 12. Accordingly, the condensing lens 12 operates and the primary electron beam 3 converges on a position of the indicated value 41 of the condensing lens focused position. The condensing lens focused position is normally set to between the objective lens 11 and the condensing lens 12.

When an indicated value 43 of detected electron energy is input into the applied voltage calculator 73 of the electrostatic deflector 21, the applied voltage calculator 73 outputs an indicated value of the voltage source 53 of the electrostatic deflector 21. Further, when the indicated value 43 of detected electron energy and the indicated value 42 of primary electron energy are input into the drive current calculator 74 of the electromagnetic deflector 22, the drive current calculator 74 outputs an indicated value of the current source 54 of the electromagnetic deflector 22 in such a way that the Wien condition is satisfied. Accordingly, the Wien filter for secondary signal deflection 23 operates and a secondary signal is deflected. At the same time, the focal position of the primary electron beam 3 on the observation sample 2 is shifted. If the focal position shift on the observation sample 2 is ΔF1 and the reduction ratio of the objective lens 11 is M, a correction amount ΔF2 of an object surface position of the objective lens 11 needed to correct ΔF1 is converted by the following formula:

$$\Delta F2 = \frac{\Delta F1}{M^2} \qquad \text{[Math 1]}$$

ΔF2 can be set by the condensing lens 12 and thus, ΔF1 can be corrected by the condensing lens 12.

The amount of change of the current value input into the current source 52 of the condensing lens 12 can be calculated by the drive current calculator 72 of the condensing lens 12 linked with the Wien filter for secondary signal deflection 23. The indicated value 41 of the condensing lens focused position, the indicated value 42 of primary electron energy, and the indicated value 43 of detected electron energy are input into the drive current calculator 72. Instead of the indicated value 43 of detected electron energy, an output value of the applied voltage calculator 73 of the electrostatic deflector 21 may be input into the drive current calculator 72.

If the indicated value 41 of the condensing lens focused position is set, a distance L1 between the condensing lens focused position and an action position of the Wien filter for secondary signal deflection 23 is obtained. When the electrostatic deflector 21 of the Wien filter for secondary signal deflection 23 is operated alone, a deflection amount X1 of the primary electron beam 3 in a position L1 away from the Wien filter for secondary signal deflection 23 is shown by the following formula:

$$X1 = s1 \cdot L1 \cdot V1 \qquad \text{[Math 2]}$$

s1 is deflection sensitivity of the electrostatic deflector 21 and V1 is an operating voltage of the electrostatic deflector 21. V1 is determined if the indicated value 43 of detected electron energy is set. If X1 as an action of the Wien filter on the primary electron beam 3 is used, ΔF2 is given by the following formula:

$$\Delta F2 = k1 \cdot X1^2 = k1 \cdot (s1 \cdot L1 \cdot V1)^2 \qquad \text{[Math 3]}$$

k1 is a coefficient used to convert the action of the Wien filter for secondary signal deflection 23 into a focal position shift and a value obtained by a calculator simulation or apparatus adjustments. The amount of change (correction value) needed to change the condensing lens focused position by ΔF2 by the condensing lens 12 and input into the current source 52 is calculated from the value obtained by adding ΔF2 to the indicated value 41 of the condensing lens focused position and the indicated value 42 of primary electron energy and is the output value of the drive current calculator 72.

The processor 93 inputs a value obtained by adding the output value of the drive current calculator 71 and the output value of the drive current calculator 72 into the current source 52. When the added value of the output value of the drive current calculator 71 and the output value of the drive current calculator 72 is input into the current source 52, a focal position shift of the primary electron beam 3 generated by an operation of the Wien filter for secondary signal deflection 23 on the observation sample 2 can be corrected by the condensing lens 12 in linkage with the Wien filter for secondary signal deflection 23.

While the correction value is calculated by the drive current calculator 72 in the above example, the correction value may be input into the current source 52 by a different method. For example, the correction value corresponding to the indicated value 41 of the condensing lens focused position, the indicated value 42 of primary electron energy, and the indicated value 43 of detected electron energy may be defined in a table in advance and stored in the storage device 94. When the indicated value 41 of the condensing lens focused position, the indicated value 42 of primary electron energy, and the indicated value 43 of detected electron energy are input into the drive current calculator 72, the drive current calculator 72 may output the correction value by referring to the table.

Figure 4:
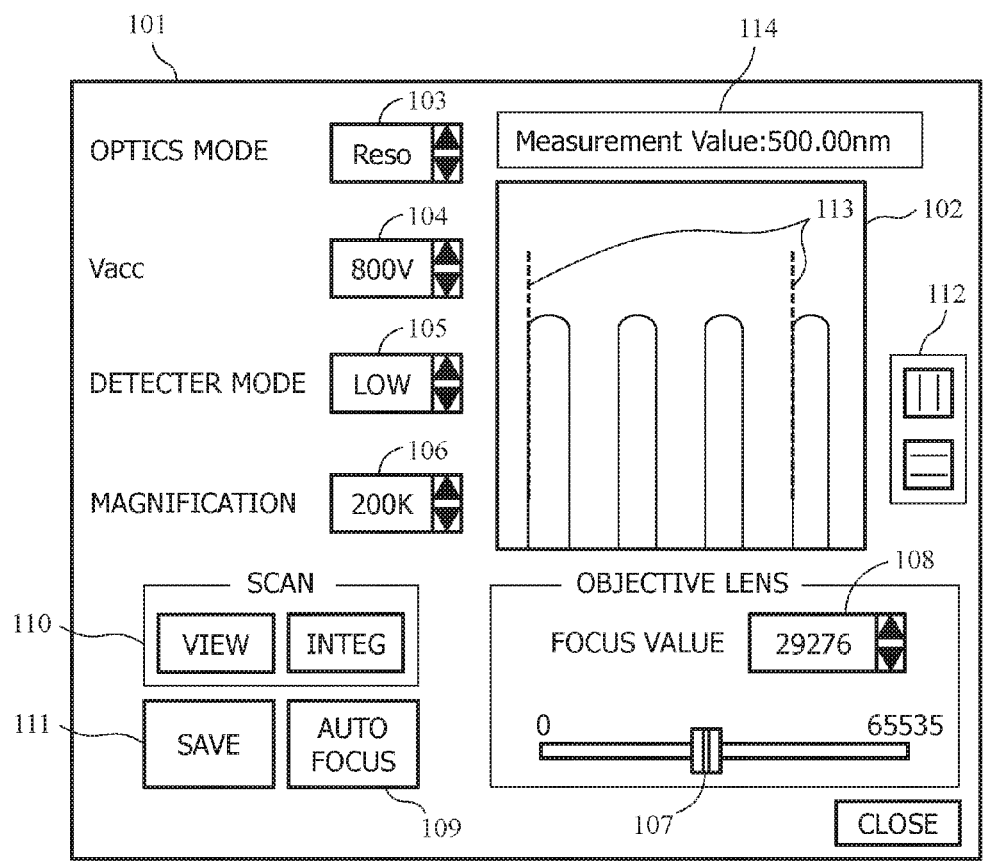
FIG. 4 is a diagram showing a configuration example of an image acquisition condition setting GUI screen according to Example 1.

FIG. 4 shows a configuration example of a GUI screen to set the aforementioned condensing lens focused position, primary electron energy, detected electron energy and the like and also to display a scanning electron microscope image obtained during settings.

A GUI screen 101 is displayed on the input/output apparatus 95. The GUI screen 101 includes an image display unit 102, a button 103 to set the optics mode, a button 104 to set the irradiation voltage of the primary electron beam 3 to the observation sample 2, a button 105 to set the detector mode, a button 106 to set the imaging magnification of an image displayed in the image display unit 102, a scroll bar 107 to set an excitation condition of the objective lens 11 and a display unit 108 of the excitation condition of the objective lens 11, a button 109 to execute auto-focus of the objective lens 11, buttons 110 to indicate an operation of a scanning deflector, a button 111 to store an image displayed in the image display unit 102 in the storage device 94, and a button 112 to measure the dimension of an observation object on an image displayed in the image display unit 102.

The setting of the button 106 may be FOV (Field Of View) of an image displayed in the image display unit 102. The optics mode set by the button 103 is used to set a beam aperture angle of the primary electron beam 3 on the observation sample 2 and the control range of a probe current and when the optics mode is set, the focused position of the condensing lens 12 is determined. When the acceleration voltage (Vacc) is set by the button 104, the primary electron energy is determined (that is, the indicated value 42=Vacc of the primary electron energy). When the detector mode is set by the button 105, detected electron energy to be detected by the detector 5 is determined. For example, when the detector mode is set by the button 105, as described with reference to FIG. 3, energy of a secondary signal to be detected can be selected.

Effects of the present example will be described. According to the configuration in the present example, even if a secondary signal to be deflected by a Wien filter is deflected by any deflection amount, deflection sensitivity of the primary electron beam 3 (primary charged particle beam) by a deflector can be held in a constant state. Thus, the operation on the GUI screen 101 in FIG. 4 is as described below.

If, after an image is displayed in the image display unit 102 by operating the button 110, the button 112 is operated, two cursors 113 appear. The dimension of an observation object is measured by moving the two cursors 113. The pitch line of a line pattern formed from equidistant pitches is desired for dimensional measurement, but the pattern is not limited to the line pattern and any pattern such as a hole pattern capable of measurement may be used. The measurement value at this point is displayed in a dimensional measurement value display unit 114.

Then, after the detector mode is switched by operating the button 105, the image is re-displayed in the image display unit 102 by operating the button 110. Here, the action of the Wien filter for secondary signal deflection 23 is changed by scanning of the button 105 and a focal position shift of the primary electron beam 3 on the observation sample 2 caused at this point is corrected by the operation described with reference to FIG. 3. As a result, a clear image without defocusing is displayed in the image display unit 102 without resetting the scroll bar 107 or operating the button 109 while the display value in the display unit 108 of the excitation condition of the objective lens 11 is held.

Then, when the dimension of the same location as the observation location before operating the button 105 is measured by operating the button 112, the dimension value displayed in the dimensional measurement value display unit 114 matches the dimension value obtained before operating the button 105 when variations within measurement accuracy are allowed for. In the present example, when the operating condition of the Wien filter 23 is changed, defocusing and astigmatism caused thereby can be corrected synchronously. With the above operation, an image can also be obtained when the operating condition of the Wien filter 23 is changed without varying the imaging magnification of the image in the image display unit 102.

In the past, when the operating condition of the Wien filter is changed, it is necessary to reset the excitation condition of the objective lens or the like and thus, the imaging magnification of an image varies and display dimensions of an acquired image cannot be held in a constant state. According to the configuration in the present example, by contrast, when the operating condition of the Wien filter 23 acting as a deflector of a secondary signal is changed, defocusing and astigmatism are corrected by the condensing lens 12 linked with the Wien filter for secondary signal deflection 23 so that display dimensions of an acquired image can be held in a constant state.

Example 2

Example 2 will be described using FIG. 5. Unless there are exceptional circumstances, matter described in Example 1 and not described in the present example can also be applied to the present example.

Figure 5:
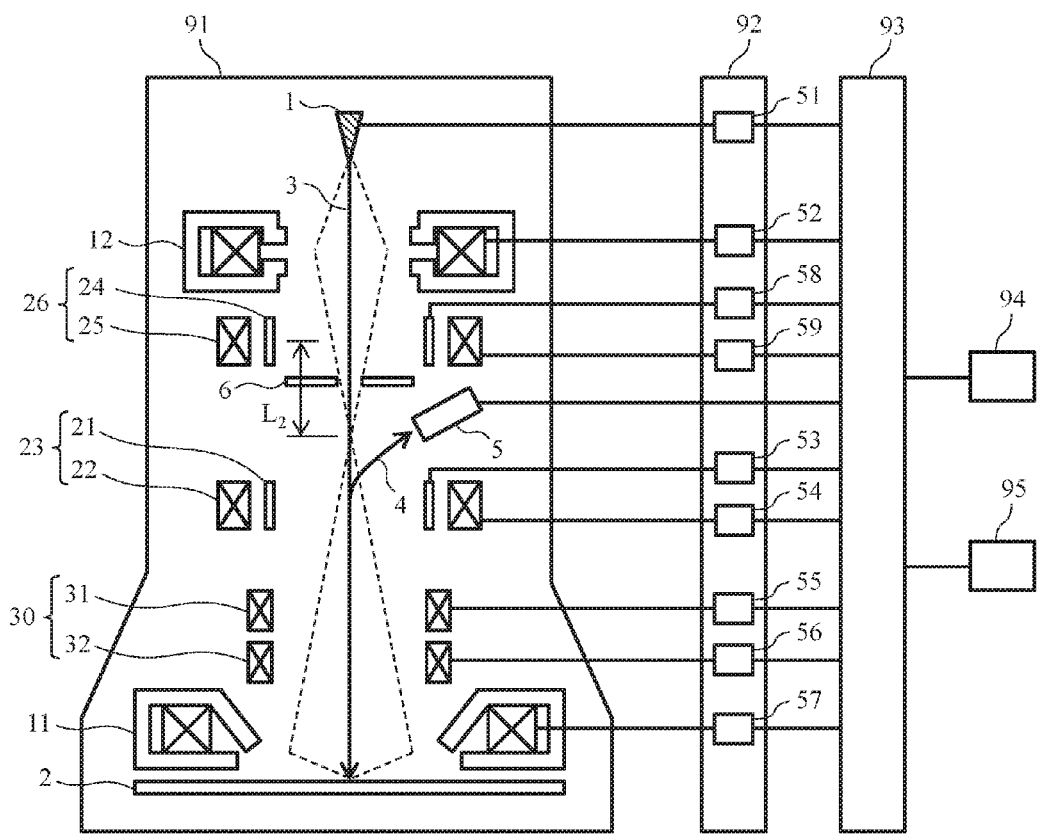
FIG. 5 is an overall configuration diagram of the charged particle beam apparatus (scanning electron microscope) according to Example 2.

FIG. 5 is an overall configuration diagram of the scanning electron microscope as a form of the charged particle beam apparatus according to the present example. The present example is different from Example 1 in that a Wien filter for chromatic aberration correction 26 is mounted for the purpose of correcting deflection color aberration generated in the Wien filter for secondary signal deflection 23. Incidentally, the same signs as those in FIG. 1 indicate the same components.

The Wien filter for chromatic aberration correction 26 is arranged on the side of the electron source 1 from the Wien filter for secondary signal deflection 23. More specifically, the Wien filter for chromatic aberration correction 26 is arranged between the condensing lens 12 and the current limiting diaphragm 6. The Wien filter for chromatic aberration correction 26 is constructed of an electrostatic deflector 24 and an electromagnetic deflector 25.

In the Wien filter for chromatic aberration correction 26, a voltage source 58 of the electrostatic deflector 24 and a current source 59 of the electromagnetic deflector 25 are driven such that the Wien condition is fulfilled. If the indicated value 41 of the condensing lens focused position is set, a distance L2 between the condensing lens focused position and an action position of the Wien filter for chromatic aberration correction 26 is obtained simultaneously with L1. When the electrostatic deflector 24 of the Wien filter for chromatic aberration correction 26 is operated alone, a deflection amount X2 of the primary electron beam 3 in a position L2 away from the Wien filter for chromatic aberration correction 26 is shown by the following formula:

$$X2 = s2 \cdot L2 \cdot V2 \quad \text{[Math 4]}$$

s2 is deflection sensitivity of the electrostatic deflector 24 and V2 is an operating voltage of the electrostatic deflector 24. Deflection color aberration D1 generated in the Wien filter for secondary signal deflection 23 and deflection color aberration D2 generated in the Wien filter for chromatic aberration correction 26 are given by the following formulas:

$$D1 = (c1 - c2) \cdot \frac{\Delta V0}{V0} \cdot X1 = (c1 - c2) \cdot \frac{\Delta V0}{V0} \cdot (s1 \cdot L1 \cdot V1) \quad \text{[Math 5]}$$

-continued $$D2 = (c3-c4) \cdot \frac{\Delta V0}{V0} \cdot X2 = (c3-c4) \cdot \frac{\Delta V0}{V0} \cdot (s2 \cdot L2 \cdot V2) \quad \text{[Math 6]}$$

c1 is a deflection color aberration coefficient of the electrostatic deflector 21, c2 is a deflection color aberration coefficient of the electromagnetic deflector 22, c3 is a deflection color aberration coefficient of the electrostatic deflector 24, c4 is a deflection color aberration coefficient of the electromagnetic deflector 25, V0 is primary electron energy emitted from the electron source 1, ΔV0 is chromatic dispersion of primary electrons emitted from the electron source 1. The coefficients c1 to c4 are values obtained in advance. The Wien filter for chromatic aberration correction 26 is operated in such a way that deflection color aberration generated in the Wien filter for secondary signal deflection 23 is canceled and so the following relationship holds:

$$V2 = \frac{c1-c2}{c3-c4} \cdot \frac{s1}{s2} \cdot \frac{L1}{L2} \cdot V1 \quad \text{[Math 7]}$$

The positive/negative sign of V2 is the same as that of V1 when the condensing lens focused position is between the Wien filter for secondary signal deflection 23 and the Wien filter for chromatic aberration correction 26 and otherwise, the inverted sign of that of V1. When controlled under this condition, the correction amount ΔF2 of an object surface position of the objective lens 11 needed to correct a focal position shift on the observation sample 2 caused by operations of the Wien filter for secondary signal deflection 23 and the Wien filter for chromatic aberration correction 26 is converted by the following formula:

$$\Delta F2 = k1 \cdot X1^2 + k2 \cdot X2^2 = \left(k1 + \frac{c1-c2}{c3-c4} \cdot k2\right) \cdot (s1 \cdot L1 \cdot V1)^2 \quad \text{[Math 8]}$$

k2 is a coefficient used to convert the action of the Wien filter for chromatic aberration correction 26 into a focal position shift and a value obtained by a calculator simulation or apparatus adjustments. Accordingly, the correction amount of the object surface position increased by an operation of the Wien filter for chromatic aberration correction 26 is determined by the distance L1 between the condensing lens focused position and the action position of the Wien filter for secondary signal deflection 23 and the indicated value 43 of detected electron energy. Thus, if, as described in Example 1, the condensing lens focused position is changed by ΔF2, a focal position shift on the observation sample 2 caused by operations of the Wien filter for secondary signal deflection 23 and the Wien filter for chromatic aberration correction 26 can be corrected. Therefore, the drive current calculator 72 may calculate a value obtained by correcting the condensing lens focused position by the above ΔF2 using the same configuration as that described with reference to FIG. 3.

With the above configuration, the processor 93 controls the Wien filter for secondary signal deflection 23, the Wien filter for chromatic aberration correction 26, and the condensing lens 12 arranged on the electron source 1 side in linkage. As a result, an image can also be obtained when the operating conditions of the Wien filters 23, 26 are changed without varying the imaging magnification of the display image.

Example 3

Example 3 will be described using FIG. 6. Unless there are exceptional circumstances, matter described in Example 1 or Example 2 and not described in the present example can also be applied to the present example.

Figure 6:
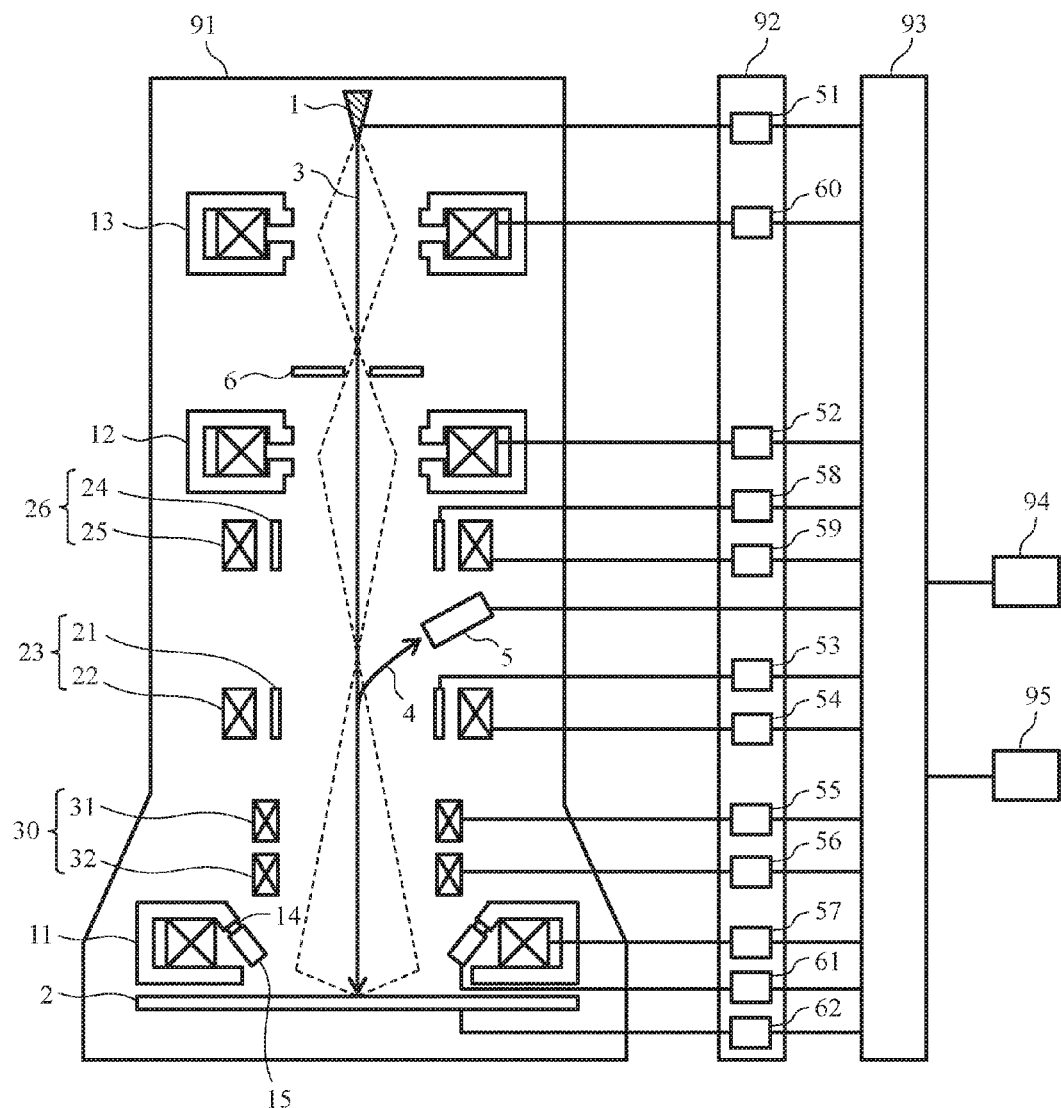
FIG. 6 is an overall configuration diagram of the charged particle beam apparatus (scanning electron microscope) according to Example 3.

FIG. 6 is an overall configuration diagram of the scanning electron microscope as a form of the charged particle beam apparatus according to the present example. Incidentally, the same signs as those in FIG. 5 indicate the same components. In the present example, when compared with Example 2, a condensing lens 13 is added to the electron source 1 side from the condensing lens 12. The present example is configured to be a able to independently set a beam aperture angle of the primary electron beam 3 and the control range of a probe current by independently controlling the two condensing lenses 12, 13.

Also, a portion of a magnetic path of the objective lens 11 is electrically separated by an insulator 14. The objective lens 11 can also be made to act as an electrostatic lens by applying a voltage to a pole piece 15 and at the same time, can apply a voltage to the observation sample 2. In the present example, high resolution can be achieved by optimizing these setting voltages. A current source 60 is connected to the condensing lens 13 and a voltage source 61 and a voltage source 62 are connected to the pole piece 15 and the observation sample 2 respectively.

In the present example, an irradiation voltage Vacc applied to the observation sample 2 of the primary electron beam 3 is given by the following formula if the voltage applied to the observation sample 2 is Vr:

$$Vacc = V0 - Vr \quad \text{[Math 9]}$$

Also in Example 3, a correction can be made by the same configuration as that described with reference to FIG. 3. In the present example, the irradiation voltage set by using the button 104 inside the GUI screen 101 in FIG. 4 becomes Vacc. The primary electron energy passing through each of the Wien filters 23, 26 is V0. Therefore, the value (Vacc+Vr) obtained by adding Vr to Vacc set by the button 104 is input into the drive current calculator 72 as the indicated value 42 of the primary electron energy.

A secondary signal obtains energy for Vr when emitted from the observation sample 2 and thus, the value (E1+Vr) obtained by adding the voltage Vr applied to the observation sample 2 to energy E1 of the secondary signal immediately before being emitted from the observation sample 2 is input into the drive current calculator 72 as the indicated value 43 of detected electron energy.

The condensing lens 13 is added in the present example and the condensing lens focused position can be changed by controlling the condensing lens 13. Thus, the indicated value 41 of the condensing lens focused position can be changed by being linked with the control of the condensing lens 13.

A focal position shift on the observation sample 2 caused by the operation of each Wien filter may be corrected, like in Example 2, by a lens on the electron source 1 side from the scanning deflectors 31, 32. If the operating condition of a Wien filter is changed in the present example, a correction may be made by the condensing lens 12 or the condensing lens 13. Thus, when a correction is made by the condensing lens 12, the same configuration as that described with reference to FIG. 3 may be used. When a correction is made by the condensing lens 13, a value obtained by adding an output value of the drive current calculator 72 and a output value of a drive current calculator (not shown) for the condensing lens 13 may be input into the current source 60.

In the present example, the processor 93 controls the Wien filter for secondary signal deflection 23, the Wien filter for chromatic aberration correction 26, and the condensing lenses 12, 13 arranged on the electron source 1 side in linkage. An image can also be obtained when the operating condition of each Wien filter is changed without varying the imaging magnification of the display image by making a correction using the condensing lens 12 or the condensing lens 13.

Incidentally, the distribution of energy of a secondary signal immediately before being emitted from the observation sample 2 is known and can be obtained in advance. The relationship between each detector mode that can be changed by the button 105 inside the GUI screen 101 in FIG. 4 and the value of the energy E1 of a secondary signal immediately before being emitted from the observation sample 2 may be stored in the storage device 94 in advance. Thus, when the detector mode is changed by operating the button 105 inside the GUI screen 101, after switched to the value of E1 corresponding to the detector mode, the value (E1+Vr) obtained by adding the voltage Vr applied to the observation sample 2 to the value of E1 after switched is input into the drive current calculator 72 as the indicated value 43 of the detected electron energy. Accordingly, an image can be obtained when the operating condition of a Wien filter is changed without varying the imaging magnification of the display image.

Example 4

Example 4 will be described using FIG. 7. Unless there are exceptional circumstances, matter described in any one of Examples 1 to 3 and not described in the present example can also be applied to the present example.

Figure 7:
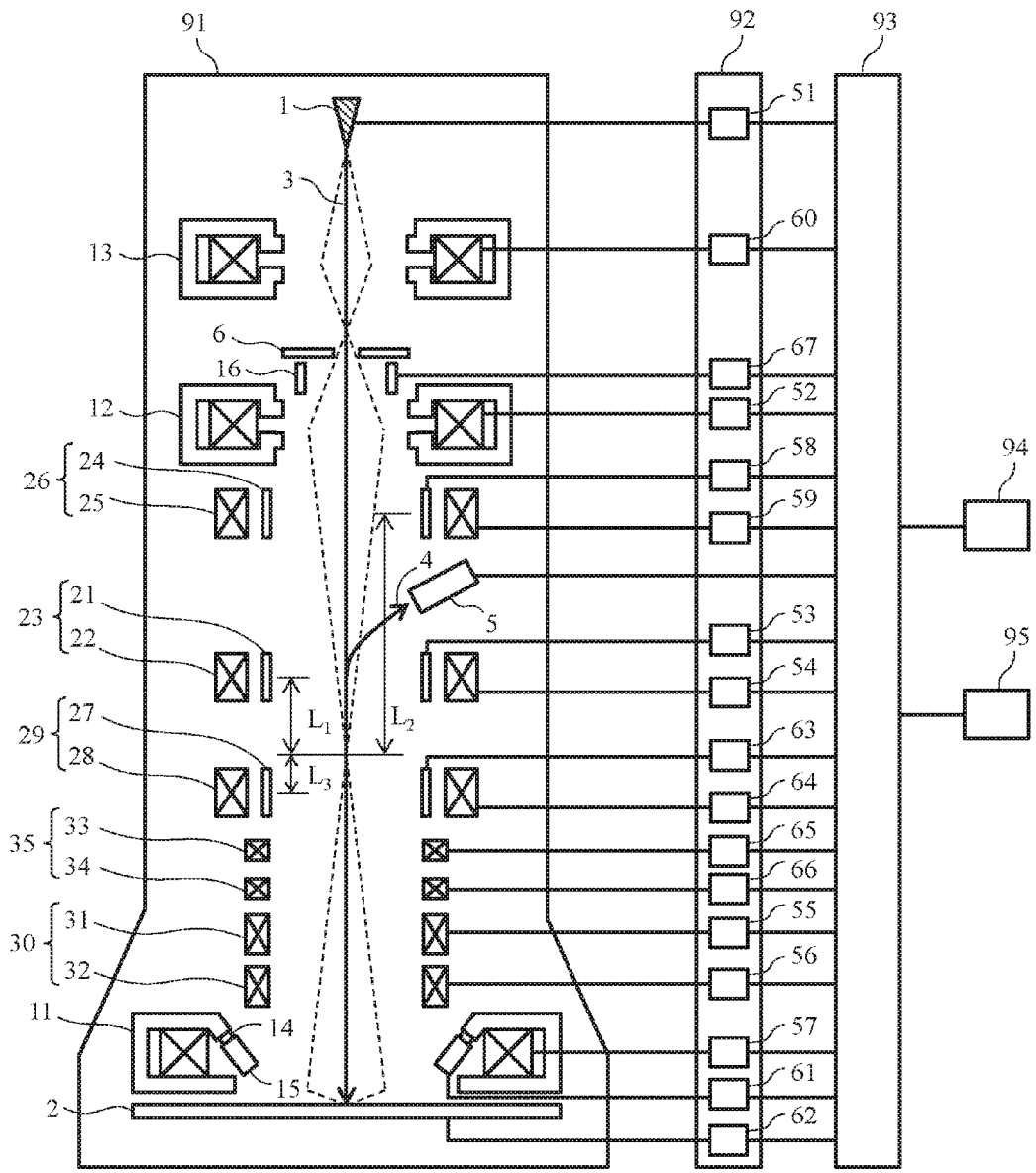
FIG. 7 is an overall configuration diagram of the charged particle beam apparatus (scanning electron microscope) according to Example 4.

FIG. 7 is an overall configuration diagram of the scanning electron microscope as a form of the charged particle beam apparatus according to the present example. Incidentally, the same signs as those in FIG. 6 indicate the same components. When compared with Example 3, a 2-stage scrolling deflector 35 operating for the purpose of moving a position deflected by the 2-stage scanning deflector 30 by beam deflection, a Wien filter 29 operating in linkage with the 2-stage scrolling deflector 35, and an electrostatic lens 16. The 2-stage scrolling deflector 35 is constructed of an upper scrolling deflector 33 and a lower scrolling deflector 34. The Wien filter 29 is constructed of an electrostatic deflector 27 and an electromagnetic deflector 28.

A current source 65 is connected to the upper scrolling deflector 33, a current source 66 is connected to the lower scrolling deflector 34, a voltage source 63 is connected to the electrostatic deflector 27, a current source 64 is connected to the electromagnetic deflector 28, and a voltage source 67 is connected to the electrostatic lens 16. If the upper scrolling deflector 33 and the lower scrolling deflector 34 are electrostatic deflectors, a voltage source may be connected instead of the current sources 65, 66.

The secondary signal 4 generated from the observation sample 2 is subject to the action of deflection by a deflection field of the upper scrolling deflector 33 and the lower scrolling deflector 34. Due the deflection, the secondary signal 4 passes through a position deviating from the axis center in the position of the Wien filter for secondary signal deflection 23. The Wien filter 29 deflects the secondary signal 4 such that the secondary signal 4 passes through the axis center in the position of the Wien filter for secondary signal deflection 23 in linkage with the operations of the upper scrolling deflector 33 and the lower scrolling deflector 34. At this point, the focal position of the primary electron beam 3 on the observation sample 2 is shifted in accordance with an operation amount of the Wien filter 29 and so the focal position shift is corrected by the lens on the electron source 1 side from the 2-stage scrolling deflector 35. The focal position shift may be corrected by the condensing lens 12 or the condensing lens 13, but the correction of the focal position shift linked with the 2-stage scrolling deflector 35 needs a high-speed operation and so is desired to be made by the electrostatic lens 16 in the present example.

The processor 93 calculates an action of the condensing lens 12 and an action of the electrostatic lens 16 from a deflection amount of a secondary electron signal of the Wien filter for secondary signal deflection 23 and a deflection amount of a secondary electron signal of the Wien filter 29 to control the Wien filter for secondary signal deflection 23, the Wien filter for chromatic aberration correction 26, the Wien filter 29, the condensing lens 12, and the electrostatic lens 16 in linkage.

If the distance between the condensing lens focused position and the action position of the Wien filter 29 is L3, the deflection amount of the primary electron beam 3 in a position L3 away from the Wien filter 29 when the electrostatic deflector 27 of the Wien filter 29 is operated alone is X3, deflection sensitivity of the electrostatic deflector 27 is s3, and the operating voltage of the electrostatic deflector 27 is V3, the correction amount ΔF2 of an object surface position of the objective lens 11 needed to correct a focal position shift on the observation sample 2 caused by the operation of each Wien filter is converted by the following formula:

$$\Delta F2 = k1 \cdot X1^2 + k2 \cdot X2^2 + k3 \cdot X3^2 = \quad \text{[Math 10]}$$
$$\left(k1 + \frac{c1-c2}{c3-c4} \cdot k2\right) \cdot (s1 \cdot L1 \cdot V1)^2 + k3 \cdot (s3 \cdot L3 \cdot V3)^2$$

k3 is a coefficient used to convert the action of the Wien filter 29 into a focal position shift and a value obtained by a calculator simulation or apparatus adjustments. Of these terms, the third term added when compared with Math 8 is corrected by the electrostatic lens 16. Though not depicted in FIG. 7, the present function can be implemented by providing an arithmetic unit that controls the Wien filter 29 and the electrostatic lens 16 in linkage inside the processor 93. As an example, the distance L3 between the condensing lens focused position and the action position of the Wien filter 29, the deflection sensitivity s3 of the electrostatic deflector 27, and the operating voltage V3 of the electrostatic deflector 27 are input into the arithmetic unit as input values. The arithmetic unit determines the value of the third term in Math 10 from these input values. The arithmetic unit may input the value corrected by the determined third term into the voltage source 67 for the electrostatic lens 16.

In the present example, an example in which only the third term of Math 10 is corrected by the electrostatic lens 16 is described, but a similar effect can also be obtained by correcting all terms of Math 10 by the electrostatic lens 16. The processor 93 controls the Wien filter for secondary signal deflection 23, the Wien filter for chromatic aberration correction 26, the Wien filter 29, and the electrostatic lens 16 in linkage. In this case, the value obtained by adding the third term to the value of Math 8 calculated by the drive current calculator 72 may be input into the voltage source 67 for the electrostatic lens 16 as a correction value.

In the present example, an image can also be obtained when the operating condition of the Wien filter 29 is changed without varying the imaging magnification of the display image.

Example 5

Example 5 will be described using FIGS. 8 and 9. Unless there are exceptional circumstances, matter described in any one of Examples 1 to 4 and not described in the present example can also be applied to the present example.

Figure 8:
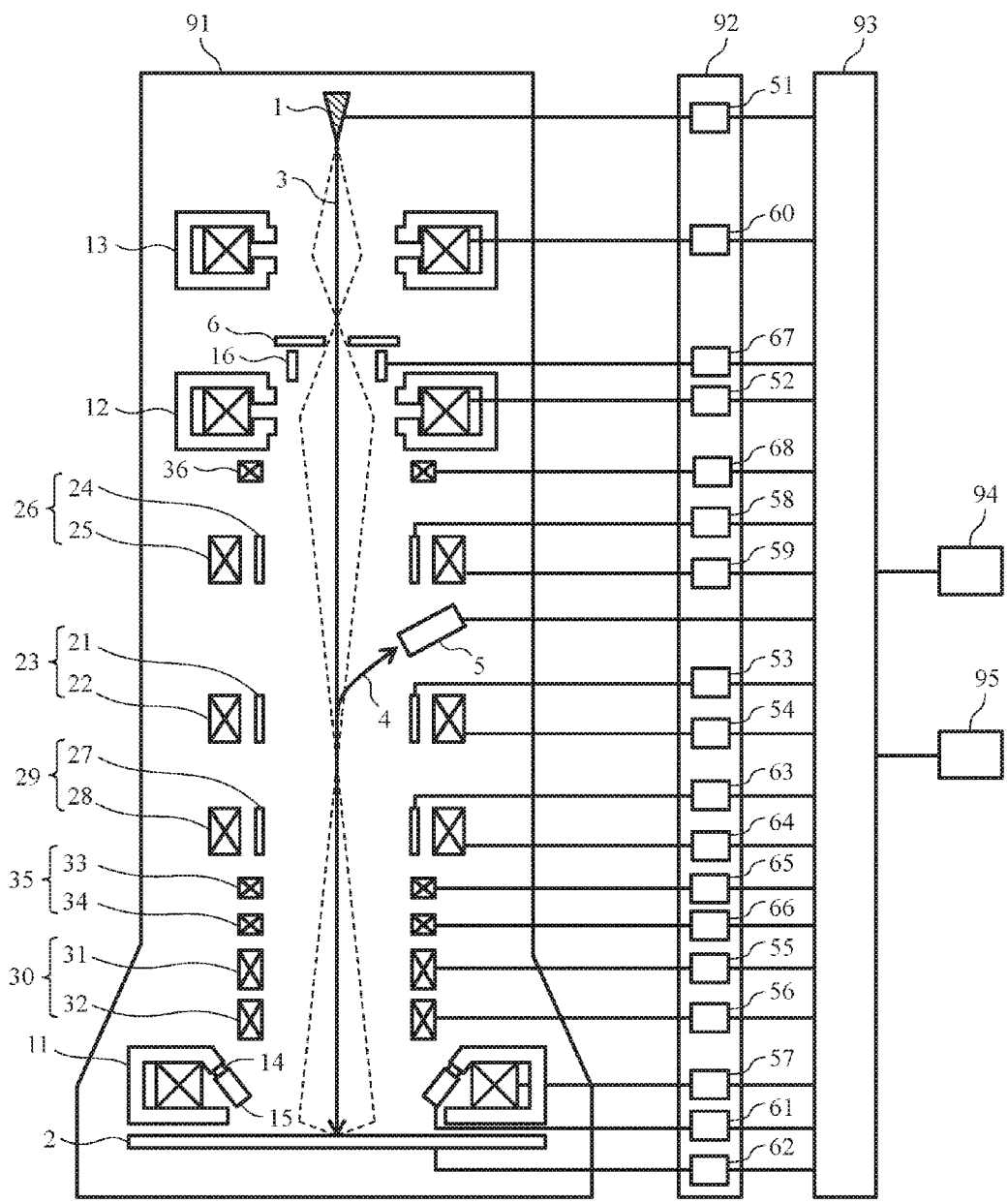
FIG. 8 is an overall configuration diagram of the charged particle beam apparatus (scanning electron microscope) according to Example 5.

FIG. 8 is an overall configuration diagram of the scanning electron microscope as a form of the charged particle beam apparatus according to the present example. Incidentally, the same signs as those in FIG. 7 indicate the same components. When compared with Example 4, an astigmatic corrector 36 is added. The current source 68 is connected to the astigmatic corrector 36.

Astigmatism caused by a Wien filter being operated can be described as a function of the operation amount of the Wien filter 29 operating in linkage with the Wien filter for secondary signal deflection 23 and the 2-stage scrolling deflector 35. Thus, astigmatism caused by the operation of each of the Wien filter for chromatic aberration correction 26 and the Wien filter 29 operating in linkage with the Wien filter for secondary signal deflection 23 and the Wien filter for secondary signal deflection 23 can automatically be corrected by controlling the astigmatic corrector 36 in linkage with the operation amount of each Wien filter.

Though not depicted in FIG. 8, the present function can be implemented by providing an arithmetic unit that controls the Wien filter for secondary signal deflection 23 and the astigmatic corrector 36 in linkage and an arithmetic unit that controls the Wien filter 29 and the astigmatic corrector 36 in linkage inside the processor 93. These arithmetic units input a correction value of astigmatism calculated based on the above function into the astigmatic corrector 36 when the detector mode (the button 105 in FIG. 9) is switched. Therefore, when the operating conditions of the Wien filters are changed, astigmatism caused by the operation of a Wien filter can automatically be corrected by controlling the Wien filter for secondary signal deflection 23, the Wien filter 29, and the astigmatic corrector 36 in linkage.

Figure 9:
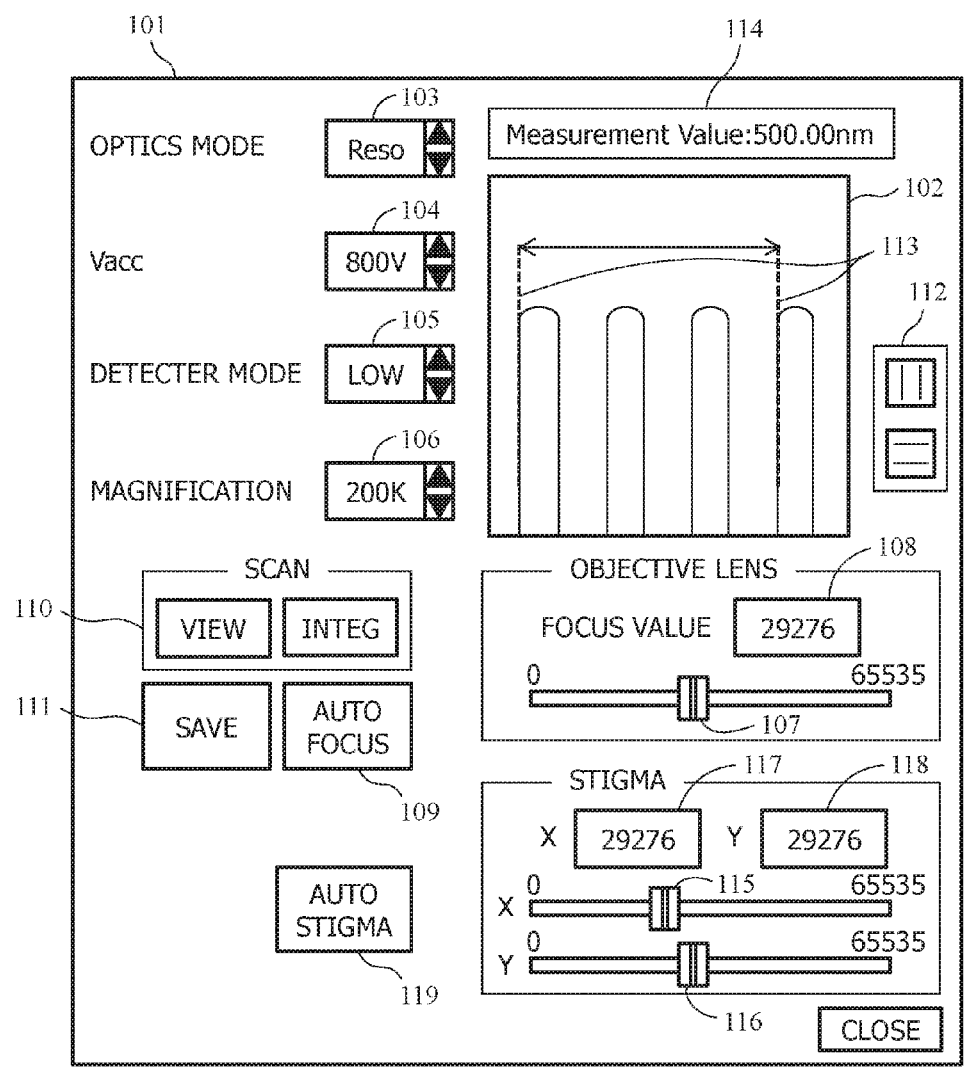
FIG. 9 is a diagram showing a configuration example of the image acquisition condition setting GUI screen according to Example 5.

FIG. 9 shows a configuration example of the GUI screen in the present example. When compared with GUI in FIG. 4 described in Example 1, a scroll bar 115 to set the condition for an X-direction astigmatic corrector, a scroll bar 116 to set the condition for a Y-direction astigmatic corrector, a display unit 117 of setting values of the X-direction astigmatic corrector, a display unit 118 of setting values of the Y-direction astigmatic corrector, and a button 119 to automatically make an astigmatic correction are added.

When the detector mode is switched by the button 105, setting conditions of the astigmatic corrector 36 automatically change in accordance with a change of the operating condition of a Wien filter. In the present example, the display of the display unit 117 of setting values of the X-direction astigmatic corrector and the display unit 118 of setting values of the Y-direction astigmatic corrector is automatically updated by correction values calculated by the above arithmetic units. That is, when the detector mode is switched by the button 105, the display of the display unit 117 of setting values of the X-direction astigmatic corrector and the display unit 118 of setting values of the Y-direction astigmatic corrector is updated without operating the scroll bar 115, the scroll bar 116, and the button 119. When only the same operation is performed by the button 105, the amount of change of numbers displayed in the display unit 117 and the display unit 118 is always constant. As a result, an image can also be obtained when the operating conditions of the Wien filters are changed without varying the imaging magnification of the display image.

The present invention is not limited to the examples described above and includes various modifications. The above examples have been described in detail to describe the present invention so as to be understood more easily and all components described above are not necessarily included. A portion of components of some example may be replaced with components of other examples. Also, components of other examples may be added to components of some example. Also, additions, deletions, or substitutions of other components may be made for a portion of components of each example.

Each calculator of the processor 93 and the like may be implemented by software in which a processor interprets and executes programs implementing each function. Information of programs, tables, files and the like to implement each function can be placed in a storage device such as a memory, a hard disk, and SSD (Solid State Drive) or a storage medium such as an IC card, an SD card, and DVD. Also, each calculator of the processor 93 described above and the like may be implemented by hardware by designing a portion or the whole thereof as an integrated circuit.

Control lines and information lines in drawings considered to be necessary for description are shown and all control lines and information lines are not necessarily shown from a product viewpoint. All components may be mutually connected.

REFERENCE SIGNS LIST 1 electron source
2 observation sample
3 primary electron beam
4 secondary signal
5 detector
6 current limiting diaphragm
7 secondary electron
8 reflected electron
9 secondary electron
10 reflected electron
11 objective lens
12 condensing lens
13 condensing lens
14 insulator
15 pole piece
16 electrostatic lens
21 electrostatic deflector
22 electromagnetic deflector
23 Wien filter for secondary signal deflection
24 electrostatic deflector
26 electromagnetic deflector
26 Wien filter for chromatic aberration correction
27 electrostatic deflector
28 electromagnetic deflector
29 Wien filter
31 upper scanning deflector
32 lower scanning deflector
33 upper scrolling deflector
34 lower scrolling deflector
36 astigmatic corrector
41 indicated value of the condensing lens focused position
42 indicated value of primary electron energy
43 indicated value of detected electron energy 51 voltage source
52 current source
53 voltage source
54 current source
55 current source
56 current source
57 current source
58 voltage source
59 current source
60 current source
61 voltage source
62 voltage source
63 voltage source
64 current source
65 current source
66 current source
67 voltage source
68 current source
71 drive current calculator of the condensing lens
72 drive current calculator of the condensing lens linked with the Wien filter
73 applied voltage calculator of the electrostatic deflector
74 drive current calculator of the electromagnetic deflector
91 electron-optical lens barrel
92 power unit
93 processor
94 storage device
95 input/output apparatus
101 GUI screen
102 image display unit
103 button
104 button
105 button
106 button
107 scroll bar
108 display unit of objective lens excitation conditions
109 button
110 button
111 button
112 button
113 cursor
114 dimensional measurement value display unit
115 scroll bar
116 scroll bar
117 display unit
118 display unit
119 button

The invention claimed is:

1. A charged particle beam apparatus comprising:
a charged particle source;
2-stage lenses for converging a primary charged particle beam emitted from the charged particle source on a sample, wherein a first lens arranged on a side of the charged particle source and a second lens arranged on the side of the sample are included;
a deflector that specifies an irradiation position of the primary charged particle beam on the sample;
a detector arranged between the 2-stage lenses to detect a secondary charged particle signal generated by the sample being irradiated with the primary charged particle beam from the sample;
a first Wien filter arranged between the detector and the second lens to deflect the secondary charged particle signal; and
a processor that controls an operating condition of the first Wien filter and a drive current of the first lens in linkage by calculating the drive current to control the first lens based on a deflection amount of the secondary charged particle signal as determined by the controlled operating condition of the first Wien filter.

2. The charged particle beam apparatus according to claim 1, wherein the processor calculates the action of the first lens by accepting a focused position of the first lens, energy of the primary charged particle beam, and detected electron energy in the detector as input values.

3. The charged particle beam apparatus according to claim 1, wherein the deflector is arranged between the 2-stage lenses.

4. The charged particle beam apparatus according to claim 1, further comprising:
a display unit that displays an image obtained from the secondary charged particle signal,
wherein when an operating condition of the first Wien filter is changed, the image is displayed in the display unit without variations of imaging magnification.

5. The charged particle beam apparatus according to claim 1, further comprising:
a second Wien filter arranged on the side of the charged particle source from the first Wien filter,
wherein the processor controls the first Wien filter, the second Wien filter, and the first lens in linkage.

6. The charged particle beam apparatus according to claim 5, wherein the processor calculates an action of the first lens from a deflection amount of the secondary charged particle signal by the first Wien filter.

7. The charged particle beam apparatus according to claim 6, wherein the processor calculates the action of the first lens by accepting a focused position of the first lens, energy of the primary charged particle beam, and detected electron energy in the detector as input values.

8. The charged particle beam apparatus according to claim 7, further comprising:
a voltage source that applies a voltage to the sample,
wherein the input value of the energy of the primary charged particle beam is a value obtained by adding a value of the voltage applied to the sample to an irradiation voltage to the sample of the primary charged particle beam, and
the input value of the detected electron energy is a value obtained by adding the value of the voltage applied to the sample to the energy of the secondary charged particle signal immediately before being emitted from the sample.

9. The charged particle beam apparatus according to claim 5, further comprising:
a third lens arranged on the side of the charged particle source from the deflector;
a second deflector arranged between the 2-stage lenses; and
a third Wien filter operated by being linked with the second deflector,
wherein the processor controls the first Wien filter, the second Wien filter, the third Wien filter, and the third lens in linkage.

10. The charged particle beam apparatus according to claim 9, wherein the processor calculates an action of the first lens and that of the third lens from a deflection amount of the secondary charged particle signal by the first Wien filter and that of the secondary charged particle signal by the third Wien filter.

11. The charged particle beam apparatus according to claim 9, wherein the processor calculates an action of the third lens from a deflection amount of the secondary charged particle signal by the first Wien filter and that of the secondary charged particle signal by the third Wien filter.

12. The charged particle beam apparatus according to claim 9, wherein the third lens is an electrostatic lens.

13. The charged particle beam apparatus according to claim 1, further comprising:
   an astigmatic corrector,
   wherein the processor controls the first Wien filter and the astigmatic corrector in linkage.

14. The charged particle beam apparatus according to claim 9, further comprising:
   an astigmatic corrector,
   wherein the processor controls the first Wien filter, the third Wien filter, and the astigmatic corrector in linkage.

* * * * *